United States Patent [19]

Yagi et al.

[11] Patent Number: 5,051,378

[45] Date of Patent: Sep. 24, 1991

[54] METHOD OF THINNING A SEMICONDUCTOR WAFER

[75] Inventors: Atsuo Yagi; Takeshi Matsushita, both of Kanagawa; Makoto Hashimoto, Tokyo, all of Japan

[73] Assignee: Sony Corporation, Tokyo, Japan

[21] Appl. No.: 432,123

[22] Filed: Nov. 6, 1989

[30] Foreign Application Priority Data

Nov. 9, 1988 [JP] Japan ............................... 63-284590
Jan. 17, 1989 [JP] Japan ..................................... 1-8300

[51] Int. Cl.$^5$ ........................................ H01L 21/304
[52] U.S. Cl. .................................. 437/225; 437/228; 437/21; 437/40; 156/645; 148/33.2; 148/DIG. 12; 148/DIG. 18
[58] Field of Search ................... 437/228, 61, 62, 67, 437/68, 78, 225, 21, 40; 148/DIG. 12, DIG. 135, DIG. 164, 33, 33.1, 33.2, 33.3; 156/636, 645, 651, 652, 653

[56] References Cited

U.S. PATENT DOCUMENTS

| | | | |
|---|---|---|---|
| 3,407,479 | 10/1968 | Fordemwalt et al. | 437/62 |
| 3,623,218 | 11/1971 | Mitarai et al. | 437/62 |
| 3,683,491 | 8/1972 | Nelson et al. | 437/62 |
| 3,755,012 | 8/1973 | George et al. | 437/62 |
| 3,844,858 | 10/1974 | Bean | 156/636 |
| 4,139,401 | 2/1979 | McWilliams et al. | 437/62 |
| 4,501,060 | 2/1985 | Fay et al. | 437/62 |
| 4,874,463 | 10/1989 | Koze et al. | 156/64 X |

FOREIGN PATENT DOCUMENTS

| | | | |
|---|---|---|---|
| 0223920 | 6/1987 | European Pat. Off. | 156/636 |
| 61-154142 | 7/1986 | Japan | 148/DIG. 135 |
| 61-159738 | 7/1986 | Japan | 437/62 |
| 62-48040 | 3/1987 | Japan | 148/DIG. 135 |
| 63-56936 | 3/1988 | Japan | 148/DIG. 135 |
| 63-250838 | 10/1988 | Japan | 148/DIG. 135 |
| 63-299359 | 12/1988 | Japan | 148/DIG. 135 |

*Primary Examiner*—Brian E. Hearn
*Assistant Examiner*—T. N. Quach
*Attorney, Agent, or Firm*—Hill, Van Santen, Steadman & Simpson

[57] ABSTRACT

A method for manufacture of a semiconductor wafer in a manner to attain a high uniformity in the thickness of a semiconductor layer, by first forming hardly polishable stoppers of mutually different thicknesses in the semiconductor, then polishing the semiconductor until the thicker stopper is exposed on one main surface of the semiconductor, subsequently removing the thicker stopper to attain a thickness less than that of the thinner stopper, and thereafter polishing the aforesaid one main surface of the semiconductor until the thinner stopper is exposed. There is also disclosed a semiconductor device of a quantum well wire structure comprising a semiconductor layer formed on an insulator substrate, a thermally oxidized film of the semiconductor layer formed on such layer, and a gate electrode fromed on one side of the semiconductor layer, wherein the channel width is determined by the thickness of the semiconductor layer. And a method of manufacturing such a semiconductor device with high precision comprises a step of forming a thin film by thermally oxidizing a semiconductor layer on an insulator substrate, a step of selectively removing the thin-film semiconductor layer, and a step of forming a gate electrode on one side of the semiconductor layer removed selectively.

5 Claims, 10 Drawing Sheets

METHOD OF THINNING A SEMICONDUCTOR WAFER

BACKGROUND OF THE INVENTION

1. Field of the Invention

The present invention relates to a method of manufacturing a semiconductor wafer and, more particularly, to a novel method adapted to manufacture a highly flat semiconductor wafer having a uniform thickness.

The present invention relates also to a semiconductor device and a method of manufacturing the same, and more particularly to those optimal for application to a semiconductor device of a quantum well wire structure.

2. Description of the Prior Art

With regard to the method for manufacture of an SOI type semiconductor substrate, the art of utilizing a joining technique has already been developed by the present applicant. FIG. 3 (A) through (D) are sectional views illustrating the sequential steps in such manufacturing method mentioned.

(A) One surface of a silicon semiconductor substrate a is selectively etched to form recesses b, b . . . each having a depth of 1000 angstroms or so as illustrated in FIG. 3 (A). Regions c, c . . . surrounded with such recesses b, b . . . are used to serve as element-forming semiconductor layers later.

(B) Subsequently, as illustrated in FIG. 3 (B), a silicon dioxide ($SiO_2$) layer d (e.g. 1 micron in thickness) is formed on the same surface of the semiconductor substrate a.

(C) Then a silicon semiconductor substrate e is joined to the surface of the silicon dioxide layer d as illustrated in FIG. 3 (C). The semiconductor substrate e is to finally become the base of the SOI type semiconductor substrate as a whole.

(D) Thereafter the reverse surface [lower surface in FIG. 3 (D)] of the semiconductor substrate a is polished to expose the surface of the silicon dioxide layer d as illustrated in FIG. 3 (D). Since the silicon dioxide ($SiO_2$) layer d has a high hardness, it serves as a stopper in the polishing step.

Figure 3A:
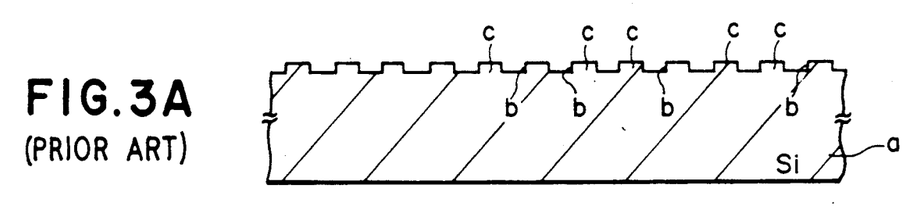
FIGS. 3A through 3D are sectional views showing the sequential steps of a background art.
Figure 3B:
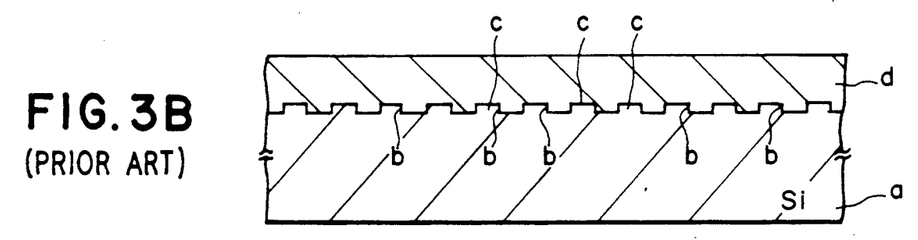
Figure 3C:
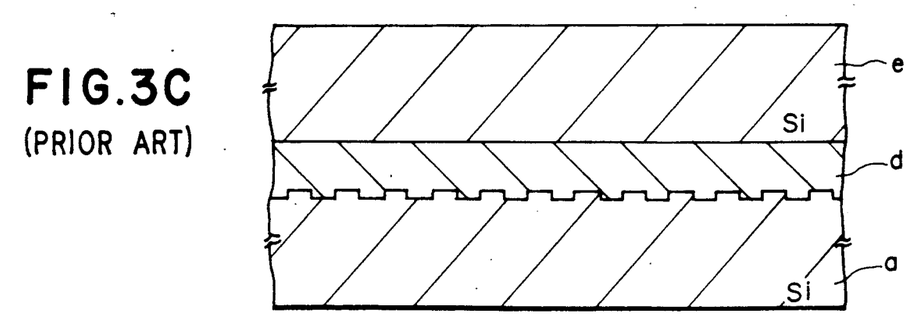
Figure 3D:
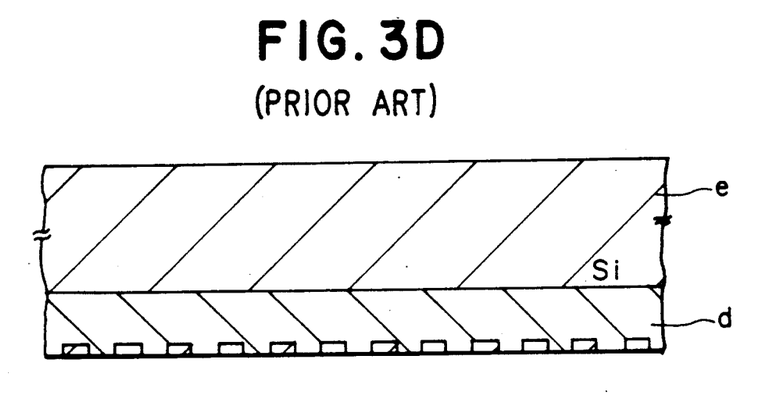

Thus, there is obtained a semiconductor wafer where the semiconductor layers c, c . . . are existent dispersively due to the silicon dioxide layer d. It is a matter of course that the lower surface of the semiconductor wafer in FIG. 3 (D) serves as the main surface thereof.

Figure 4:
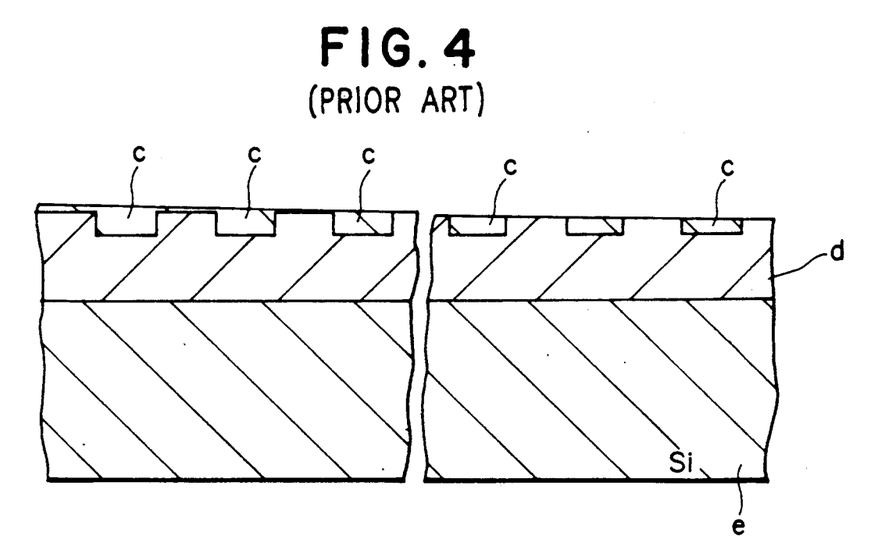
FIG. 4 is a sectional view representing the problems to be solved by the present invention.

According to the semiconductor wafer manufacturing method shown in FIG. 3, there exists a problem that the semiconductor layers c, c . . . are prone to become nonuniform in thickness as shown in FIG. 4. Since the silicon semiconductor wafer has a size of 4 to 8 inches, some thickness variation of 1 to 2 microns may occur if the silicon semiconductor wafer of such dimensions is polished to a depth of 600 microns or so. Consequently, as illustrated in the left-hand area of FIG. 4, the semiconductor layers c, c . . . become excessively thicker to be connected eventually to one another through silicon. Meanwhile in some other portions, the semiconductor layers c, c . . . become thinner as illustrated in the right-hand area of FIG. 4. It follows that, in such portions, the silicon dioxide layer d serving as a stopper is somewhat polished to be thinner. As a result, there may arise a fault that, in the worst case, some portions of the semiconductor layers c, c . . . are completely eliminated by the polishing. Accordingly, the yield rate is deteriorated in the production to consequently bring about nonnegligible impediment in realizing low-cost production of IC, LSI, VLSI and so forth.

Figure 8:
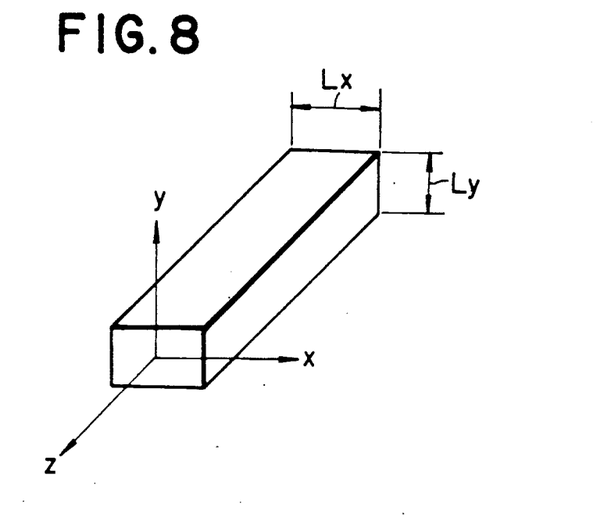
FIG. 8 is a perspective view illustrating a quantum well wire.

Meanwhile, the possibility of practically applying a quantum well wire structure was first discussed back in 1980 (Jpn. J. Appl. Phys. 19 (1980) L735). As shown in FIG. 8, a quantum well wire is so fine that sectional dimensions Lx and Ly thereof are substantially equivalent to the de Broglie wavelength $\lambda e$ (e.g. 200 angstroms) of electron. In such quantum well wire, the motions of electrons are quantized in the x- and y-directions, so that the electron motions are permitted merely in the longitudinal direction along the well wire, i.e. in the z-direction alone. Consequently the electrons are rendered one-dimensional. In such quantum well wire, the entire electrons are within the ground level and the elastic scattering thereof is suppressed, so that its application is desirable with regard to a field effect transistor (FET) where the electron mobility is high.

However, if an attempt is made to realize a quantum well wire structure in, for example, a silicon, (Si) MOSFET, the dimension Lx is not reducible beyond 2000 angstroms due to the restriction concerning the lithography, thereby bringing about difficulties in producing a silicon MOSFET of a quantum well wire structure.

OBJECTS AND SUMMARY OF THE INVENTION

It is therefore an object of the present invention to provide an improved method of forming semiconductor layers which are uniform in thickness.

Another object of the invention resides in providing an improved semiconductor device adapted to realize a quantum well wire structure.

And a further object of the invention is to provide a method of manufacturing a semiconductor device of a quantum well wire structure with high precision.

For achieving the above-described objects, in a method for manufacture of a semiconductor wafer, the present invention is so contrived as to attain a high uniformity in the thickness of a semiconductor layer by first forming hardly polishable stoppers of mutually different thicknesses in the semiconductor, then polishing the semiconductor until the thicker stopper is exposed on one main surface of the semiconductor, subsequently removing the thicker stopper to attain a thickness less than that of the thinner stopper, and thereafter polishing the aforesaid one main surface of the semiconductor until the thinner stopper is exposed.

The semiconductor device of the present invention comprises a semiconductor layer formed on an insulator substrate, a thermally oxidized film of the semiconductor layer formed on such layer, and a gate electrode formed on one side of the semiconductor layer, wherein the channel width is determined by the thickness of the semiconductor layer. According to such constitution, it becomes possible to realize a semiconductor device of a quantum well wire structure.

And the semiconductor device manufacturing method of the invention comprises a step of forming a thin film by thermally oxidizing a semiconductor layer on an insulator substrate; a step of selectively removing the thin-film semiconductor layer; and a step of forming a gate electrode on one side of the semiconductor layer removed selectively. The above method is capable of producing a semiconductor device of a quantum well wire structure with high precision.

Any other objects, features, advantages and effects of the present invention than those mentioned above will become more apparent from the following detailed description and the accompanying drawings.

BRIEF DESCRIPTION OF THE DRAWINGS

FIGS. 1 and 2 illustrate an exemplary embodiment for carrying out the semiconductor wafer manufacturing method of the present invention, in which

DESCRIPTION OF THE PREFERRED EMBODIMENTS

Hereinafter the semiconductor wafer manufacturing method of the present invention will be described in detail with reference to a preferred embodiment shown in the accompanying drawings.

Figure 1A:
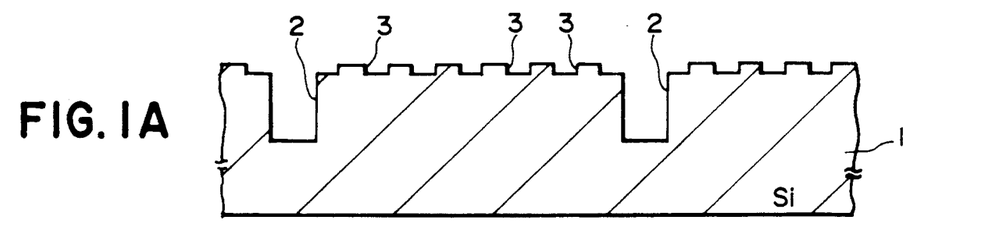
FIGS. 1A through 1F are sectional views showing the sequential steps of the method.
Figure 1B:
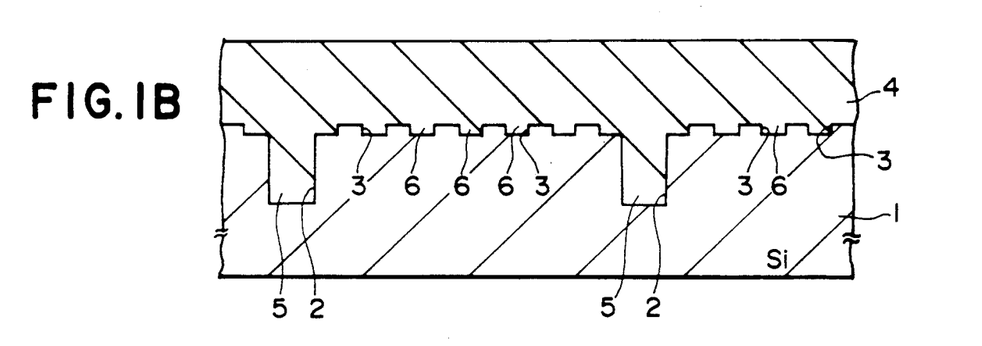
Figure 1C:
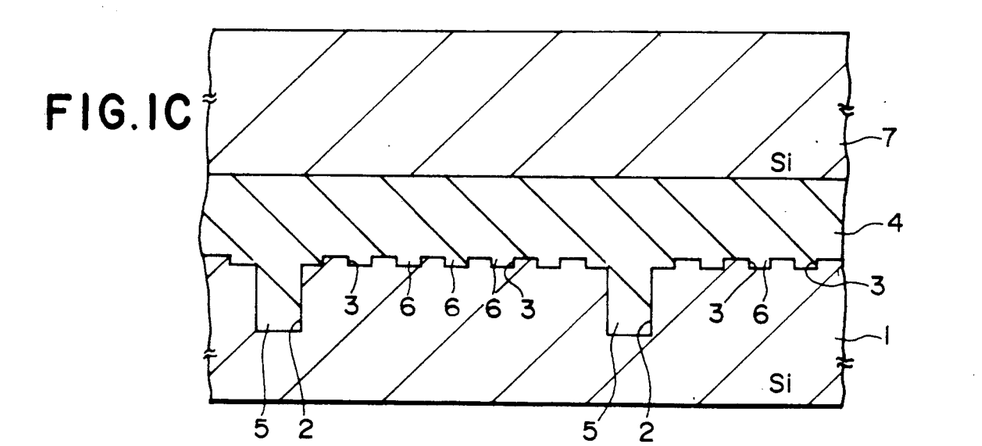
Figure 1D:
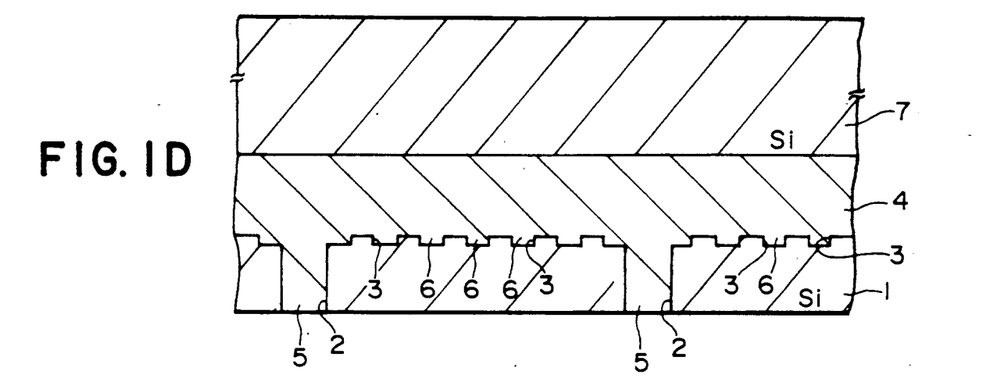
Figure 1E:
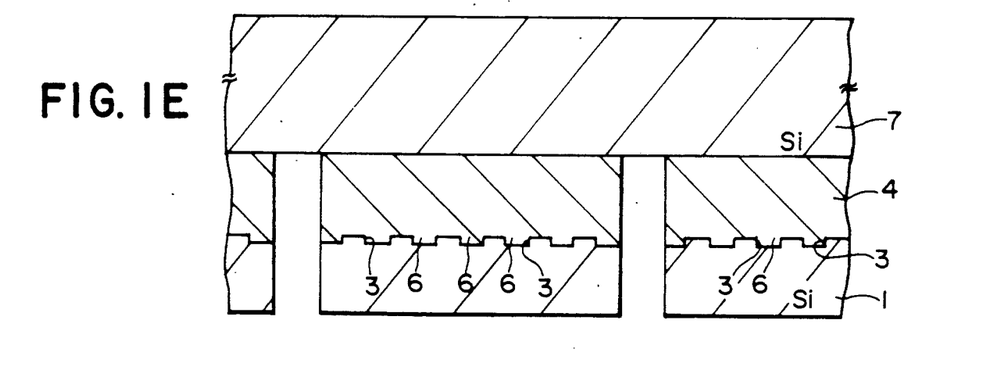
Figure 1F:
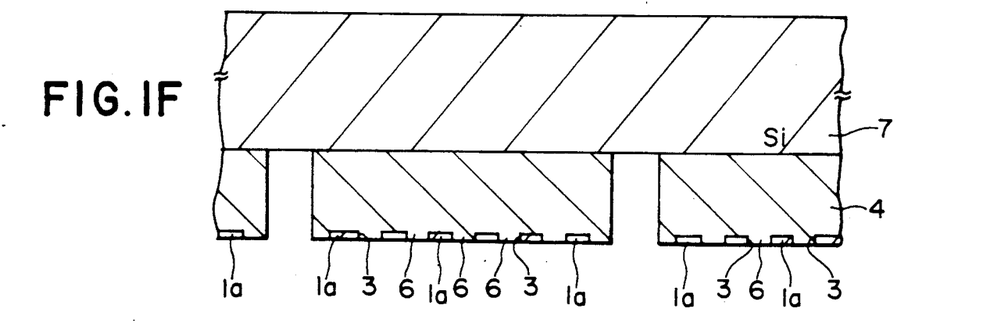
Figure 2:
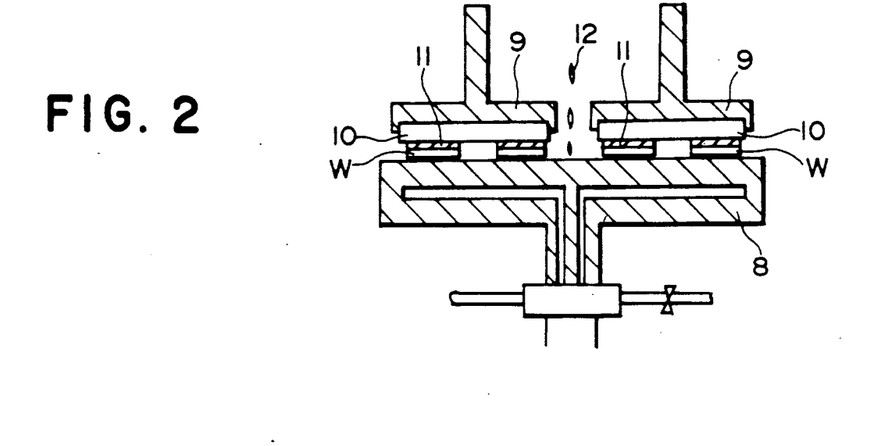
FIG. 2 is a schematic sectional view of an apparatus used for the polishing operation.

FIGS. 1 and 2 illustrate an exemplary embodiment contrived to carry out the semiconductor wafer manufacturing method of the invention, in which FIG. 1 (A) through (F) are sectional views representing the sequential steps of such method.

(A) As illustrated in FIG. 1 (A), there are formed, in the surface of a semiconductor substrate 1, deep recesses 2 of several thousand angstroms in depth and shallow recesses 3 of one thousand angstroms or less. The deep recess 2 is formed in a portion to become a scribe region, while the shallow recess 3 is formed in a portion to define a field insulator film within an area which is surrounded with such scribe region and is used as a semiconductor chip later. It makes no difference if the deep recess 2 or the shallow recess 3 is formed first.

(B) Then a silicon dioxide (SiO$_2$) layer 4 is formed on the surface of the semiconductor substrate 1 by a process of, e.g. CVD (chemical vapor deposition), and thereafter the surface of the silicon dioxide layer 4 is flattened. FIG. 1 (B) illustrates the state posterior to such flattening. Denoted by 5 is a portion filling the deep recess 2 of the silicon dioxide layer 4 to serve as a first stopper. And denoted by 6 is a portion filling the shallow recess 3 to serve as a second stopper.

(C) Subsequently a semiconductor substrate 7 is joined to the surface of the silicon dioxide layer 4 as illustrated in FIG. 1 (C). This semiconductor substrate 7 finally serves as the substrate of the semiconductor wafer.

(D) Thereafter the bottom surface of the semiconductor substrate is polished until the first stopper 5 of the silicon dioxide layer 4 is exposed as illustrated in FIG. 1 (D).

FIG. 2 is a schematic sectional view of an exemplary polishing apparatus including a level block 8; heads 9, 9; mount plates 10, 10 attached to the heads 9, 9; and a wax 11 through which a semiconductor wafer W to be polished is secured to the mount plate 10. And a polishing operation is performed by moving the semiconductor wafer W relatively to the level block 8 by means of the heads 9, 9 in a state where an abrasive material 12 is interposed between the surface of the semiconductor wafer W to be polished and the level block 8. One of preferred abrasive materials is obtained by dispersing fine particles (e.g. 0.02 micron or so in particle size) of high-purity quartz into an alkaline solution of pH 10 to 11. During the polishing operation, the abrasive material 12 is dripped onto the level block 8 while the semiconductor wafer W is rotated with a slight gap maintained to the level block 8. It is also permitted of course to adopt the known polishing method which performs the operation while keeping a polishing cloth in contact with the surface of the semiconductor wafer W. However, according to such conventional method, there exists the possibility that the polishing cloth may be compressed and deformed along the surface of the semiconductor wafer W. Consequently the polishing with an abrasive material is considered superior.

(E) Then the first stopper 5 of the silicon dioxide layer 4 exposed on the surface of the semiconductor wafer 1 is removed by the process of RIE (reactive ion etching) or wet etching. FIG. 1 (E) illustrates a state after removal of the first stopper 5. Although in this embodiment the first stopper 5 is wholly removed in its entire thickness, such complete removal is not exactly necessary. However, the minimum necessity is to execute the polishing until the thickness of the first stopper 5 becomes less than that of the second stopper 6.

(F) Thereafter a second polishing operation is performed until the surfaces of the second stoppers 6, 6 . . . of the silicon dioxide layer 4 are exposed as illustrated in FIG. 1 (F). Denoted by 1a, 1a . . . are semiconductor layers separated by the second stoppers 6, 6 . . . of silicon dioxide and used to form thereon elements such as transistors. Such second stoppers 6, 6 . . . directly serve as field insulator films. It is preferred that this polishing operation be performed in the same manner as the foregoing first polishing operation. Of course the conventional method employing a polishing cloth may be adopted as well.

In this semiconductor wafer manufacturing method, the polishing after joining the semiconductor wafers together is executed in two stages. In the first polishing stage, the first stopper 5 positioned in the scribe region is used as a stopper to achieve macroscopic flattening. In this stage, thickness variation of the first stoppers 5 caused to the polishing corresponds to thickness variation of the semiconductor wafer substantially directly, and such variation ranges from 1 to 2 microns in the entire wafer. However, after termination of the first polishing stage, the first stopper 5 is so removed that its thickness becomes equal to or smaller than that of the second stopper 6, and then another polishing operation is performed while using the second stopper 6, whereby the thickness variation relative to the first stopper 5 is eliminated to nil. And by the next polishing with the second stopper 6, complete flattening can be realized in the microscopic region of each semiconductor chip. That is, in the stage posterior to termination of the first polishing operation, there is existent some thickness variation on the reverse surface of the semiconductor substrate 1. However, the first stoppers 5 composed of hardly polishable silicon dioxide with such thickness variation are removed immediately thereafter, and merely the semiconductor alone is left on the surface. And in the semiconductor which is a workpiece to be polished, such thickness variation can be eliminated almost completely in the second polishing operation. Although the thickness variations of the second stoppers 6, 6 . . . correspond to those of the semiconductor wafer, fundamentally the film thicknesses of the second stoppers 6, 6 . . . are substantially uniform, so that in the second polishing operation for abrading the semiconductor of a slight thickness, the stoppers 6, 6 . . . are scarcely abraded differently from the first polishing operation. Thus, it becomes possible to attain a remarkably uniform film thickness of the individual semiconductor layers.

As described hereinabove, the semiconductor wafer manufacturing method of the present invention comprises a step of forming, in a semiconductor, at least a first stopper of a hardly polishable material and a second stopper thinner than the first stopper, a step of polishing the semiconductor until the first stopper is exposed, a step of removing the first stopper until the same becomes equal in thickness to the second stopper, and a step of polishing the semiconductor until the second stopper is exposed.

Therefore, according to the above-described method of the present invention, even relatively great thickness variation of 1 to 2 microns or so caused in the entire semiconductor wafer during the first polishing step can almost be eliminated in the subsequent stage where the first stopper is removed after termination of the first polishing step. And the second polishing step is executed to finish the surface where such thickness variation is no longer existent, so that the thickness variation left finally on the surface is merely slight in value induced in the second polishing step. Consequently, the thickness variation can be rendered extremely small in comparison with the conventional polishing operation performed in a single step.

Now a description will be given with regard to another embodiment which represents an exemplary case of applying the invention to a silicon MOSFET of a quantum well wire structure.

FIG. 5A through 5H illustrate the sequential steps of a method for manufacture of a silicon MOSFET according to this embodiment.

Figure 5A:
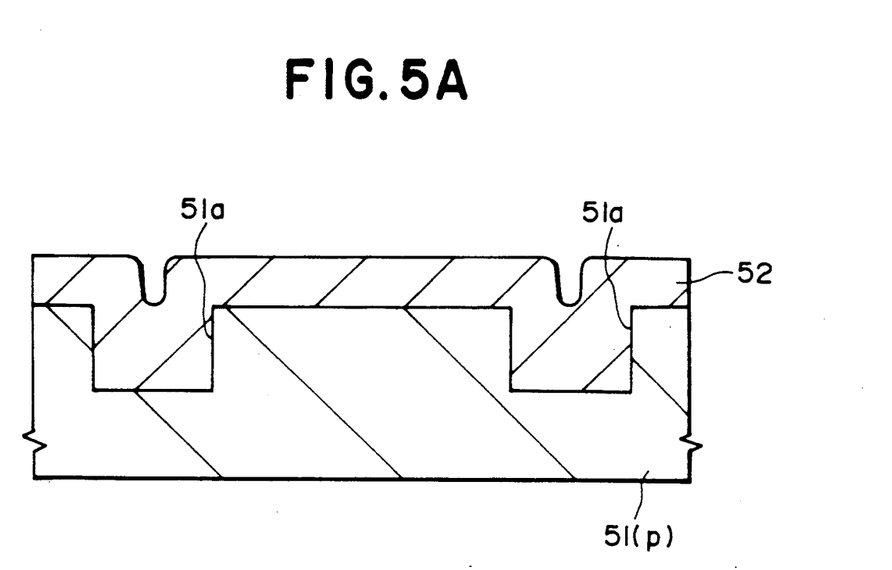
FIGS. 5A through 5G are sectional views showing the sequential steps of an exemplary method for manufacture of a silicon MOSFET of a quantum well wire structure according to the present invention.

In this embodiment, as shown in FIG. 5A, selective etching is first performed by a process of reactive ion etching (RIE) on one main surface of a monocrystal p-type silicon substrate 51, thereby forming recesses of 1000 angstroms or so in depth. Then the surface of the p-type silicon substrate 51 is thermally oxidized to form a silicon dioxide (SiO$_2$) film (not shown), and thereafter this film is removed by etching to eliminate the crystal defect caused in the surface layer of the p-type silicon substrate 51 by the preceding RIE. Subsequently a silicon dioxide film 52, for example, is formed on the entire surface by a process of CVD (chemical vapor deposition) or thermal oxidation.

Figure 5B:
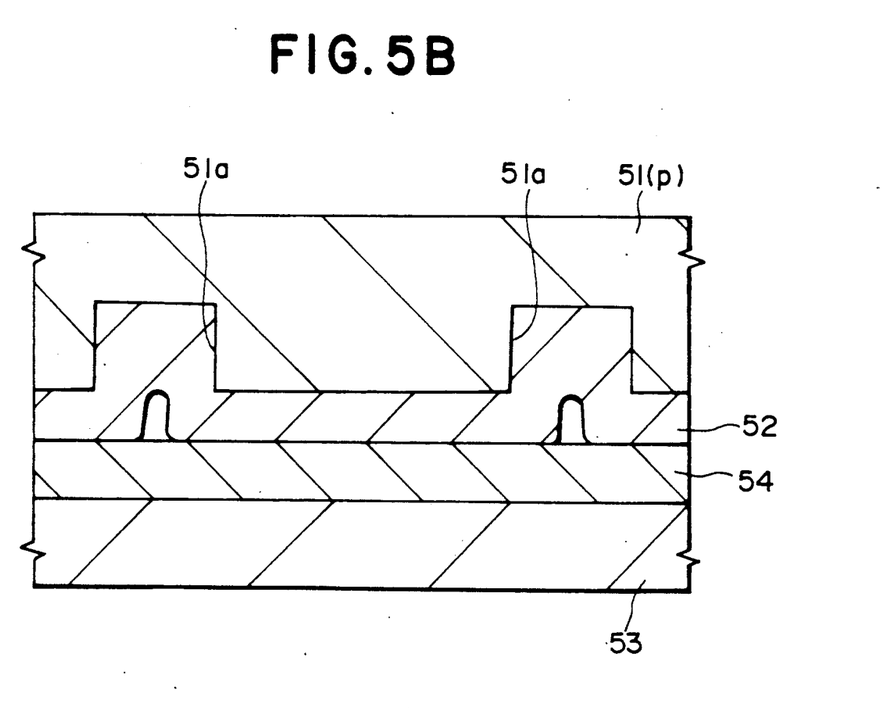

Meanwhile, there is prepared another silicon substrate 53 with a silicon dioxide film 54 formed thereon, as shown in FIG. 5B. Then, the aforementioned p-type silicon substrate 51 is mounted on the silicon substrate 53 in such a manner that the silicon dioxide film 52 is retained in contact with the silicon dioxide film 54, and in the presence of an oxygen atmosphere or the like, heat treatment is executed at a high temperature of, e.g. 100° C. to join the two silicon substrates 51 and 53 together.

Figure 5C:
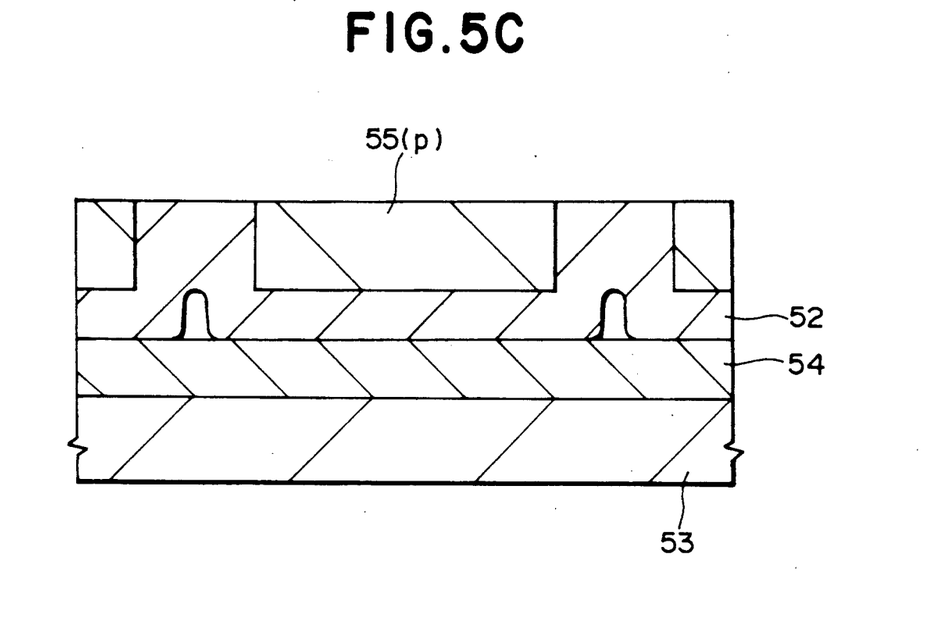

In the next stage, the p-type silicon substrate 51 is ground until the silicon dioxide film 52 formed at the bottom of the recess 51a is exposed from the other main surface of the substrate 51, whereby a monocrystal p-type silicon layer 55 of 1000 angstroms or so in depth is formed in the shape of an island as shown in FIG. 5C. The p-type silicon layer 55 is formed on the silicon dioxide films 52, 54 in the so-called SOI (silicon on insulator) structure. The grinding operation is performed mostly by mechanical lapping and finally by polishing which is a combination of mechanical and chemical actions. In this case, considering that the damage caused by the lapping is about 2 microns in depth, the lapping is performed until the height of the silicon dioxide film 52 formed at the bottom of the recess 51a becomes about 2 microns from the film surface, and thereafter the polishing is performed. In the polishing step, the high-hardness silicon dioxide film 52 serves as a stopper to automatically halt the polishing upon exposure of the silicon dioxide film 52.

Figure 5D:
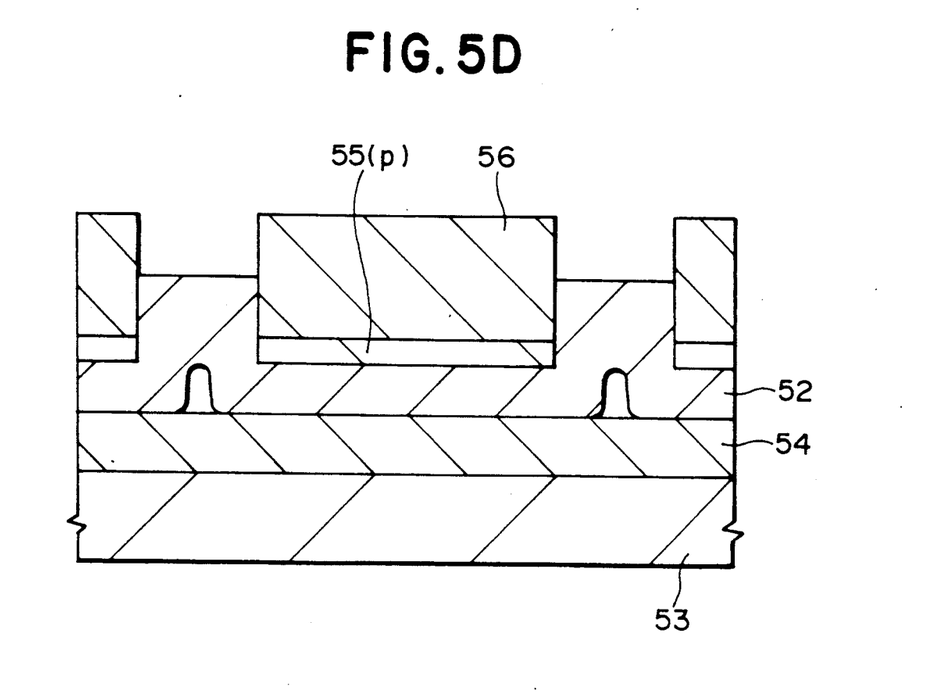

In the next step, as shown in FIG. 5D, the aforementioned p-type silicon layer 55 is thermally oxidized to form a silicon dioxide film 56 having a thickness of 1400 angstroms or so, whereby the p-type silicon layer 55 is partially shaped into a thin film of about 300 angstroms in thickness.

Figure 5E:
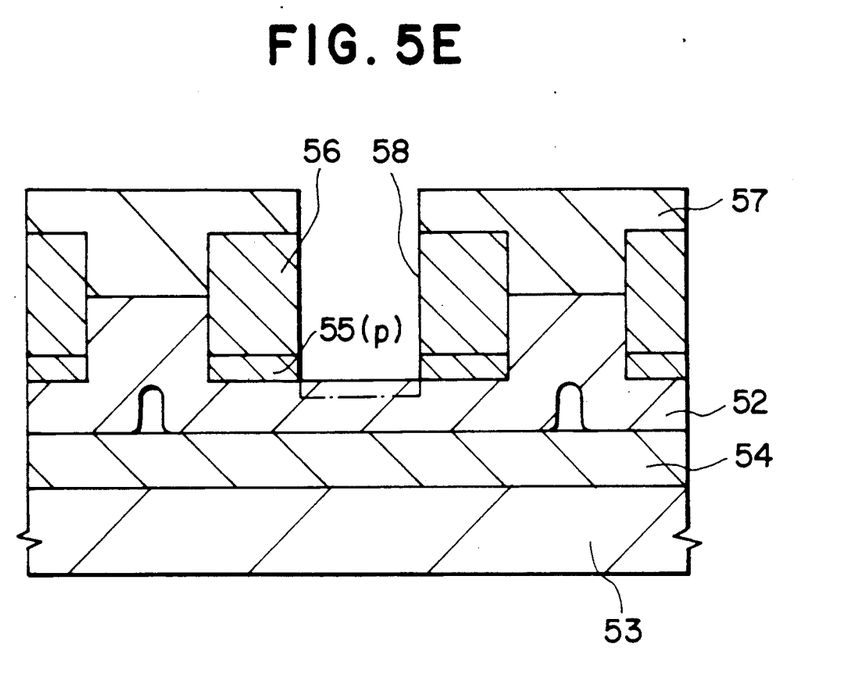

Subsequently, as shown in FIG. 5E, a resist pattern 57 having a predetermined contour is formed by lithography, and then the silicon dioxide film 56 and the p-type silicon layer 55 are anisotropically etched by RIE process or the like in the direction perpendicular to the substrate surface with the resist pattern 57 used as a mask, thereby forming a rectangular opening 58. Such etching may be terminated upon exposure of the silicon dioxide film 52, or over-etching may be performed to a depth indicated by, for example, a one-dot chain line.

Figure 5F:
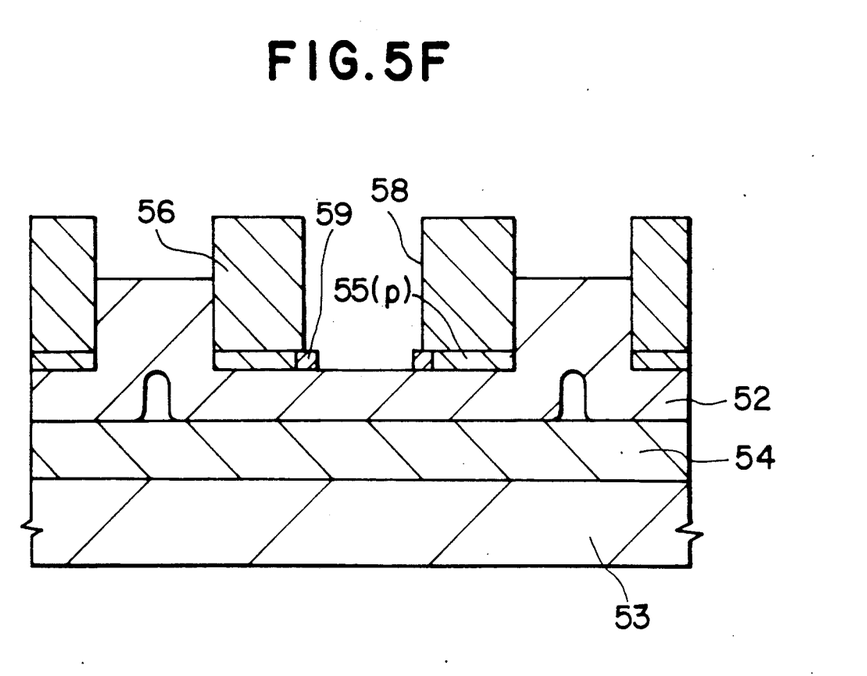

After removal of the resist pattern 57, the p-type silicon layer 55 is thermally oxidized again to form, as shown in FIG. 5F, a gate silicon dioxide film 59 of about 200 angstroms in thickness on one side of the p-type silicon layer 55 exposed below the two sides of the opening 58, and simultaneously such p-type silicon layer 55 is partially shaped into a thin film of about 200 angstroms in thickness.

Figure 5G:
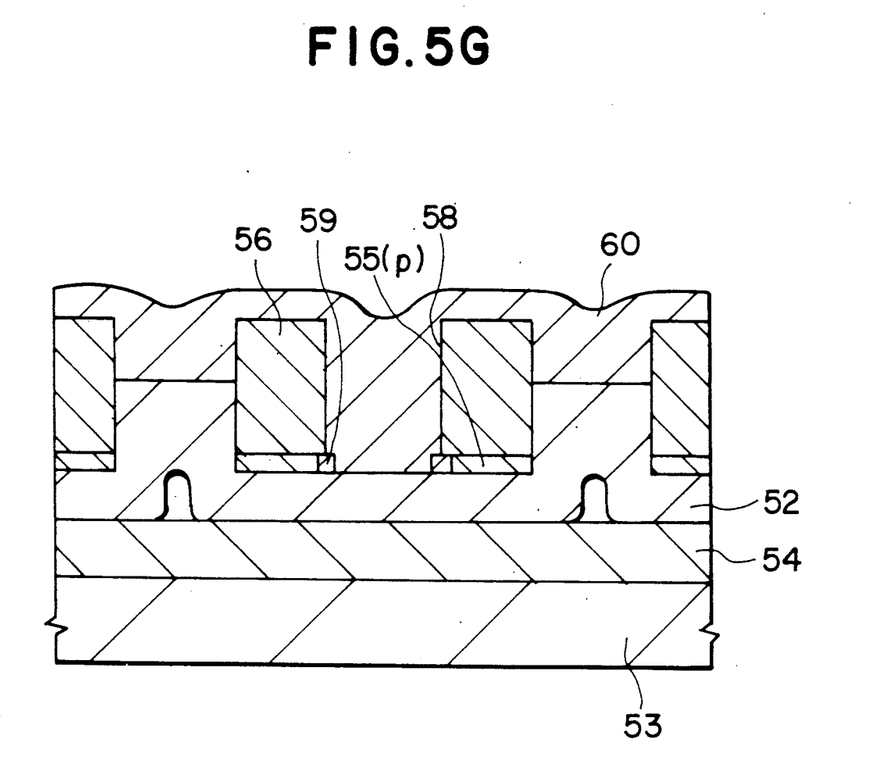

In the next step, as shown in FIG. 5G, a gate electrode film 60 composed of polycrystal silicon, aluminum or the like is formed on the entire surface.

Figure 5H:
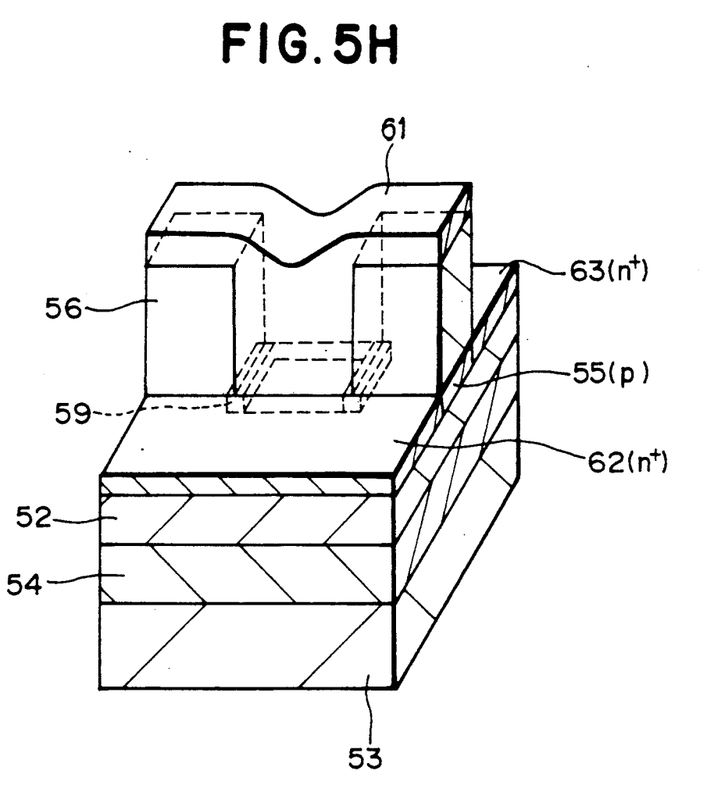
FIG. 5H is a perspective view showing a state after forming a gate electrode, a source region and a drain region posterior to the steps of FIGS. 5A through 5G.

Thereafter a resist pattern (not shown) having a predetermined contour is formed on the gate electrode film 60, and both the film 60 thus obtained and the silicon dioxide film 56 are etched in succession anisotropically by RIE process or the like with the resist pattern used as a mask, whereby a gate electrode 61 is formed as shown in FIG. 5H. Subsequently, with the resist pattern and the gate electrode 61 used as masks, an n-type impurity such as arsenic (As) is ion-implanted at a high concentration into the p-type silicon layer 55 exposed on the two sides of the gate electrode 61 by the etching, so that an n$^+$-type source region 62 and an n$^+$-type drain region 63 are formed in a self-matched state with respect to the gate electrode 61. In this case, it is also possible to form a source region 62 and a drain region 63 by ion-implanting an n-type impurity in a state where the silicon dioxide film 56 having a thickness of several hundred angstroms is left on the p-type silicon layer 55, instead of etching the silicon dioxide film 56 so deep as to expose the p-type silicon layer 55.

Thereafter a heat treatment is executed for electric activation of the implanted impurity, and then an interlayer insulator film, a contact hole and metallic wiring (not shown) are formed to complete a desired silicon MOSFET.

Figure 6:
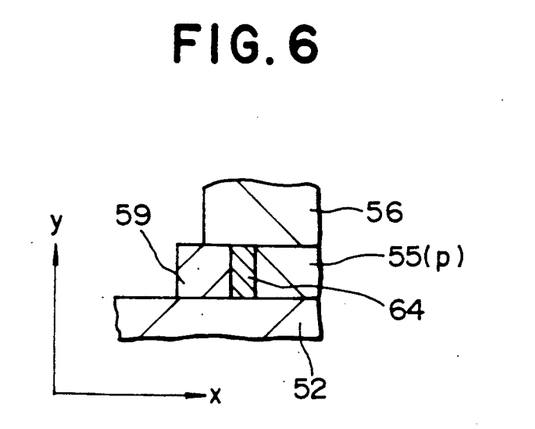
FIG. 6 is a partial enlarged sectional view of FIG. 5H showing an n-type inverse layer formed by application of a gate voltage.

In such silicon MOSFET of the above-described constitution produced by this embodiment, an n-type inverse layer (channel) 64 is formed, by applying a gate voltage to the gate electrode 61, in the p-type silicon layer 55 proximate to the interface between the gate silicon dioxide film 59 and the p-type silicon layer 55, as shown in FIG. 6. In this case, the n-type inverse layer 64 is formed on each of the two sides of the p-type silicon layer 55. Such n-type inverse layer 64 has an effective thickness of 100 angstroms or so. The vertical dimension of the n-type inverse layer 64, i.e. the channel width thereof, is equivalent to the thickness of the p-type silicon layer 55 and is therefore 200 angstroms or so. Thus, the sectional dimensions Lx and Ly of the n-type inverse layer 64 become substantially equivalent to the de Broglie wavelength $\lambda 3$, so that a quantum well wire is composed of such n-type inverse layer (channel) 64.

According to this embodiment, as described above, first the p-type silicon layer 55 formed on the silicon dioxide film 52 is thermally oxidized to shape a thin film of about 300 angstroms in thickness, and then a gate silicon dioxide film 59 is formed on one side of the p-type silicon layer 55 by thermal oxidation. And simultaneously the p-type silicon layer 55 is shaped into a thin film having a thickness of about 200 angstroms, thereby forming a MOS structure where the channel width is substantially equivalent to the de Broglie wavelength $\lambda e$. Thus, a silicon MOSFET of a quantum well wire structure can be manufactured with high precision despite the restriction concerning the lithography. The silicon MOSFET of such quantum well wire structure is capable of performing an ultrahigh-sped operation.

Furthermore, since the p-type silicon layer 55 is formed in a recess shaped in the silicon dioxide film 52, it is isolated with complete insulation to consequently attain perfect separation between silicon MOSFETs when integrating a plurality of such FETs.

Although the present invention has been described specifically with reference to an exemplary embodiment thereof, it is to be understood that the invention is not limited to the above embodiment alone, and a variety of modifications based on the technical concept thereof may be contrived as well.

For example, in addition to the above embodiment representing an exemplary case of applying the present invention to a silicon MOSFET, the invention is application also to, e.g. a Schottky gate FET. In this case, an n-type silicon layer is used in place of the p-type silicon layer 55 and, similarly to the aforementioned embodiment, such n-type silicon layer is partially shaped into a thin film of several hundred angstroms in thickness. And after an opening 58 is formed, a Schottky gate electrode is formed directly on one side of the n-type silicon layer. However, before forming such Schottky gate electrode, the transverse dimension Lx of the n-type silicon layer needs to be reduced substantially to the de Broglie wavelength $\lambda e$. This condition can be achieved by reducing, through thermal oxidation, the transverse dimension of the n-type silicon layer after forming the opening 58.

Figure 7:
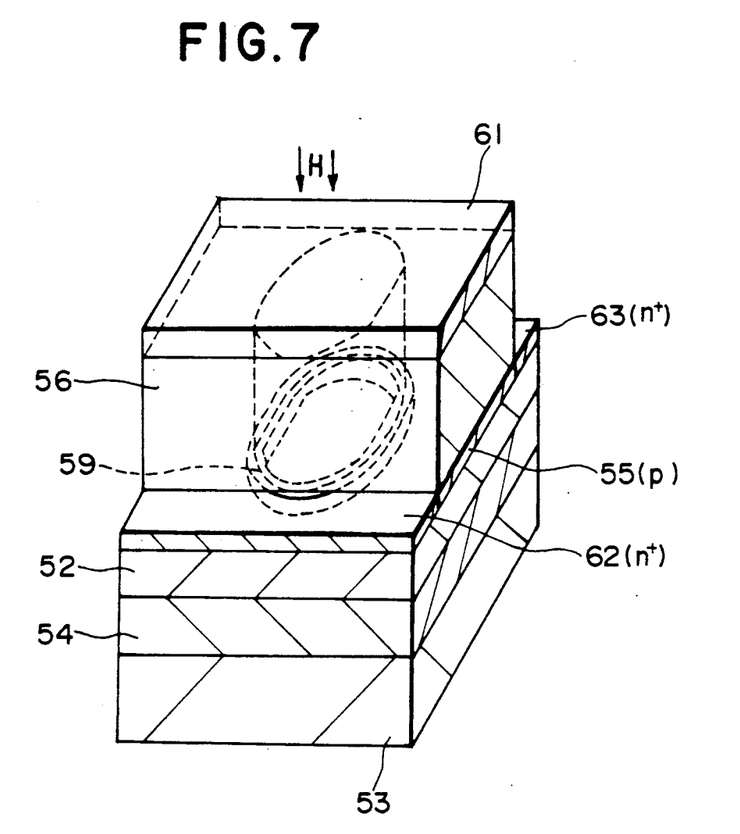
FIG. 7 is a perspective view illustrating another exemplary embodiment of the present invention.

The present invention is further applicable to a transistor utilizing Aharonov-Bohm effect (hereinafter referred to as AB effect transistor). FIG. 7 shows an example of such AB effect transistor. For manufacture of an AB effect transistor, as illustrated, the rectangular opening 58 in the above embodiment may be modified in shape to a scaphoid, and the gate silicon dioxide film 59 may be formed on one side of the p-type silicon layer 55 exposed to such scaphoid opening 58. It is preferred in this case that the dimensions of the junction among the source region 62, the drain region 63 and the n-type inverse layers 64 formed on the two sides of the p-type silicon layer 55 be substantially equal to or less than the de Broglie wavelength $\lambda e$. In this AB effect transistor, the electron waves emitted from the source region 62 are divided into two currents which pass through two n-type inverse layers 64 formed on the two sides of the p-type silicon layer 55, and thereafter such two electron currents join again in the drain region 63. In this stage, there occurs interference of the electron waves. Then a magnetic field H is applied in the direction perpendicular to the substrate surface in a state where the n-type inverse layer 64 is formed by impressing a gate voltage to the gate electrode 61, and the phase difference between the two electron currents passing through the n-type inverse layers 14 is controlled by the magnetic field thus applied, thereby performing a transistor operation. According to this example, an AB effect transistor can be realized with facility.

Due to the constitution described hereinabove, there are ensured the following effects.

Firstly, it becomes possible to realize an improved semiconductor device of a quantum well wire structure.

Secondly, the invention is adapted to manufacture an improved semiconductor device of a quantum well wire structure with high precision.

And thirdly, the invention is capable of achieving complete isolation of the semiconductor layer with perfect insulation.

What is claimed is:

1. A method of thinning a semiconductor wafer to a precisely controlled thickness, comprising the steps of:
    forming, on a first surface of a first semiconductor substrate, at least a first recess and a second recess shallower than said first recess;
    forming, on said first substrate of said first semiconductor substrate, a layer of hardly polishable material thicker than said recess which is greater than said first recess to serve as a first stopper and said second recess to serve as a second stopper;
    flattening said first surface of said first semiconductor substrate;
    joining a second semiconductor substrate to said layer of hardly polishable material;
    polishing a second surface of said first semiconductor substrate until said first stopper is exposed;
    removing at least a portion of said first stopper at said second surface until the thickness of said first stopper become equal to or less than that of said second stopper; and
    polishing said semiconductor until said second stopper is exposed.

2. A method according to claim 1, wherein said semiconductor is composed of silicon.

3. A method according to claim 1 or 2, wherein said first stopper is formed in a scribe region of said wafer, whereby semiconductor chips may be mutually isolated.

4. A method according to claim 1, wherein said polishing step is executed while supplying an abrasive material between said semiconductor and a level block, and causing a relative movement between said level block and said semiconductor.

5. A method according to claim 4, wherein said abrasive material is composed of an alkaline solution containing high-purity quartz.

* * * * *